United States Patent [19]

Taguchi et al.

[11] 4,165,557

[45] Aug. 28, 1979

[54] APPARATUS FOR TRIMMING AND SECURING ELECTRONIC COMPONENTS INSERTED INTO A PRINTED CIRCUIT SUBSTRATE

[75] Inventors: Yoshinobu Taguchi; Kotaro Harigane; Tetsuro Ito, all of Tokyo, Japan

[73] Assignee: Tokyo Denki Kagaku Kogyo Kabushiki Kaisha, Tokyo, Japan

[21] Appl. No.: 860,415

[22] Filed: Dec. 13, 1977

[30] Foreign Application Priority Data

Dec. 13, 1976 [JP] Japan .................................. 51-148712
Feb. 12, 1977 [JP] Japan .............................. 52-16052[U]
Feb. 14, 1977 [JP] Japan .............................. 52-15659[U]

[51] Int. Cl.² ...................... B23P 23/00; B23Q 41/00; B21F 1/00
[52] U.S. Cl. ..................................... 29/566.3; 29/715; 140/105; 227/79
[58] Field of Search .................... 29/566.3, 566.1, 714, 29/715, 741, 33 F, 33 M, 564.8; 140/105, 93 D; 227/79

[56] References Cited

U.S. PATENT DOCUMENTS

| 2,902,689 | 9/1959 | Petersen ............................. 29/741 X |
| 3,414,024 | 12/1968 | Anderson et al. .............. 29/566.3 X |
| 3,429,170 | 2/1969 | Romeo ............................ 29/566.3 X |
| 3,986,533 | 10/1976 | Woodman, Jr. ..................... 140/105 |
| 4,087,034 | 5/1978 | Kikkawa et al. ............... 29/566.1 X |

Primary Examiner—Horace M. Culver
Attorney, Agent, or Firm—Blum, Moscovitz, Friedman & Kaplan

[57] ABSTRACT

An apparatus for trimming and securing parallel lead electronic components inserted in a printed circuit substrate is provided. The apparatus includes a selectively rotatable driving assembly selectively displaceable towards an electronic component inserted into a printed circuit substrate, a lead bending assembly mounted on the driving assembly for bending the leads, and a cutting assembly mounted on the bending assembly for cutting the leads, the bending and cutting assemblies actuated by displacement of the driving assembly. The apparatus may include a sub-assembly for disposal of chips removed from the leads during cutting and a detection sub-assembly for detecting the presence of an inserted electronic component.

16 Claims, 18 Drawing Figures

APPARATUS FOR TRIMMING AND SECURING ELECTRONIC COMPONENTS INSERTED INTO A PRINTED CIRCUIT SUBSTRATE

BACKGROUND OF THE INVENTION

This invention relates generally to an apparatus for trimming and securing an electronic component inserted into a printed circuit substrate, and particularly to an apparatus for cutting and bending the leads of a parallel lead electronic component to secure the component to a printed circuit substrate. Apparatus for automatically cutting and bending the leads of an electronic component inserted into lead receiving holes of a printed circuit board have come into wide use recently. However, the conventional apparatus employed have a drawback in that they cannot perform the bending operations efficiently. This often results in a component falling out of the holes of the printed circuit board during storage or transportation of the board.

In addition, a problem arises concerning disposal of the chips of leads generated during the cutting operations. Unless suitable measures are taken, the chips may fall between moving parts of the apparatus causing failure which results in down time of the apparatus. Another problem often experienced is that the printed circuit is incomplete because an electronic component falls out of the holes after it is inserted but prior to being trimmed and secured. In this case the position of the circuit is vacant and the circuit is inoperable. The conventional apparatus could not detect the absence of a designated electronic component and the apparatus performed the cutting and bending operation in vain. Thus, it is highly desirable to provide an apparatus that can determine the presence of the designated electronic component prior to performing the cutting and bending operation. In addition, such an apparatus would perform the cutting and bending operations only when the lead receiving holes are filled by the electronic component prior to proceeding to the next phase of the operation.

SUMMARY OF THE INVENTION

Generally speaking, in accordance with the invention, an apparatus for cutting and bending the leads of a parallel lead electronic component inserted into the lead receiving holes of a printed circuit substrate for securing the electronic component to the printed circuit substrate is provided. The apparatus includes a base, a driving cylinder assembly mounted on the base and adapted to be displaced towards the underside of the substrate at the location of the lead receiving holes, a driving shaft assembly slideably mounted in the driving cylinder assembly selectively displaceable toward the substrate, a bending assembly mounted on the shaft assembly for bending the leads of the inserted component and a cutting assembly mounted on the bending assembly for cutting the leads at a predetermined length. The bending and cutting assemblies are adapted to be actuated by the displacement of the shaft assembly as it is displaced towards the substrate. The cutting assembly may include a sub-assembly for disposal of chips removed from the trimmed leads and a detection sub-assembly for detecting the presence of an electronic component inserted into designated lead receiving holes.

Accordingly, it is an object of this invention to provide an improved apparatus for cutting and bending the leads of an electronic component inserted into a printed circuit substrate.

Another object of the invention is to provide an improved apparatus for cutting and bending the leads of an electronic component inserted into a printed circuit substrate which disposes of the chips generated during the cutting operation of the apparatus.

A further object of the invention is to provide an improved apparatus for cutting and bending the leads of an electronic component inserted into a printed circuit substrate which can detect the presence of the electronic component in the lead receiving openings of the substrate.

Still another object of the invention is to provide an improved apparatus for cutting and bending the leads of an electronic component inserted into a printed circuit substrate which is actuated by pneumatic pressure for displacing the assembly towards the substrate.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
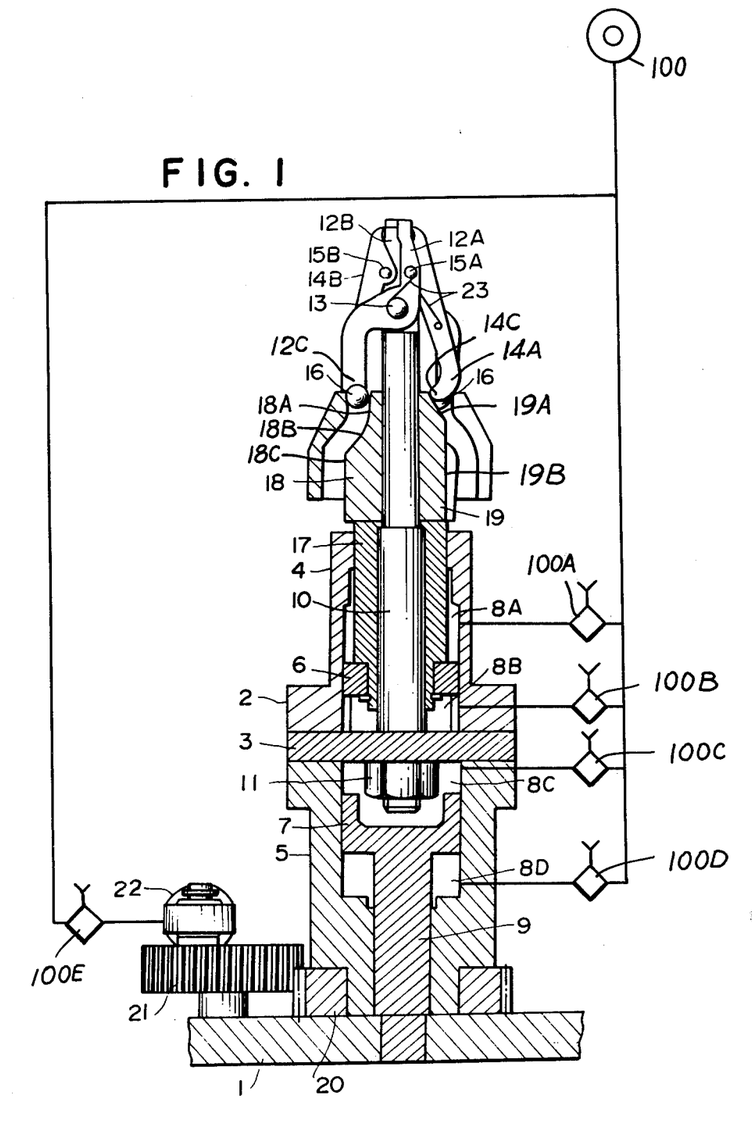
FIG. 1 is a vertical cross-sectional view of an apparatus for cutting and bending the leads of an electronic component inserted into a printed circuit substrate constructed and arranged in accordance with the invention.

Referring now to FIG. 1, an apparatus for cutting and bending the leads of an electronic component inserted into a printed circuit substrate constructed and arranged in accordance with the invention is shown. The apparatus includes an elongated pneumatic driving cylinder 2 mounted on a base 1. Driving cylinder 2 is formed with an upper cylinder 4 and a lower cylinder 5 defined by a partition 3. A cylindrically shaped upper piston 6 and a cylindrically shaped lower piston 7 are slideably engaged in upper and lower cylinders 4 and 5, respectively. Upper cylinder 4 is divided into a first cylinder chamber 8A and a second cylinder chamber 8B by upper piston 6 and lower cylinder 5 is divided into a third cylinder chamber 8C and a fourth cylinder chamber 8D by lower piston 7. Each chamber is formed air-tight in order to permit displacement of pistons 6 and 7 by pneumatic pressure.

A lower piston rod 9 is integrally formed with lower piston 7 and is secured at its lower end to base 1. An elongated shaft 10 is secured to partition 3 at its lower end by a nut 11 and extends through the vertical axis of driving cylinder 2 from partition 3 up through and out of the top of driving cylinder 2. An elongated cylindrical cam rod 17 is slideably mounted on drive shaft 10 and is secured at its lower end to piston 6 with its upper portion extended beyond the upper end of driving cylinder 2. A pair of bending cams 18 and a pair of cutter cams 19 are integrally formed at the upper portion of cam rod 17 above the top of driving cylinder 2 slideably mounted about the upper portion of driving shaft 10.

Figure 7:
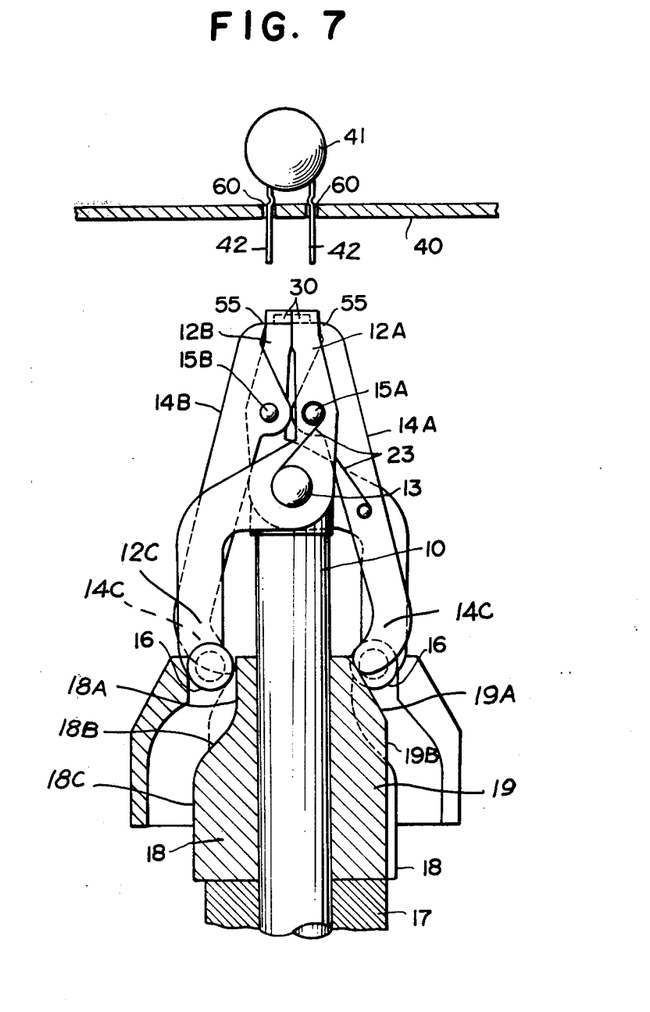
FIGS. 7–10 are partial cross-sectional front elevational views of the bending and cutting assemblies of the apparatus depicted in FIG. 1 at various stages of displacement and operation.

Referring now to FIG. 7, a parallel lead electronic component 41 formed with two parallel leads 42 is shown inserted into a pair of lead receiving holes 60 formed in a printed circuit substrate 40. The upper portion of the apparatus is shown in position beneath electronic component 41 prior to displacement towards printed circuit substrate 40 for performing the cutting and bending operations.

A pair of opposed elongated bending levers 12A and 12B are pivotally secured by a pin 13 to the upper portion of driving shaft 10. A pair of opposed cutting levers 14A and 14B, each formed with a cutting edge 55 at its upper end are pivotally secured by pins 15A and 15B, respectively, to the inner opposed surfaces of bending levers 12A and 12B, respectively. The rear ends of bending levers 12A and 12B each are formed with a camming portion 12C and cutting levers 14A and 14B each are formed with a camming portion 14C and the rear end of the opposed pairs of levers are biased towards each other by a spring 23 secured about pin 13.

A pair of rollers 16 are rotatably mounted on camming portions 12C of bending levers 12A and 12B and each roller 16 is adapted to engage its respective bending cam 18 for displacing the upper portions of bending levers 12A and 12B away from each other when rollers 16 are driven along bending cam surface 18 of bending cam 18 as driving cylinder 2 is displaced along driving shaft 10 towards printed circuit substrate 40. Camming portions 14C at the rear ends of cutting levers 14A and 14B are adapted to engage cutting cam 19 as driving cylinder 2 is displaced along driving shaft 10 towards printed circuit substrate 40.

Each bending cam 18 is formed with an upper cam vertical surface 18A for initial engagement of rollers 16 on bending levers 12A and 12B, a cam bending surface 18B inclined downwardly and away from the vertical axis of driving cylinder 2 for spreading camming portions 12C apart, and a lower vertical surface 18C for maintaining the relative position of bending levers 12A and 12B after the bending operation. Each cutting cam 19 is formed with a cam cutting surface 19A for initial engagement of camming portion 14C on cutting levers 14A and 14B inclined downwardly and away from the vertical axis of driving cylinder 2 for spreading camming portions 14C apart, and a lower cam vertical surface 19B for maintaining the relative position of cutting levers 14A and 14B after the cutting operation.

Figure 2:
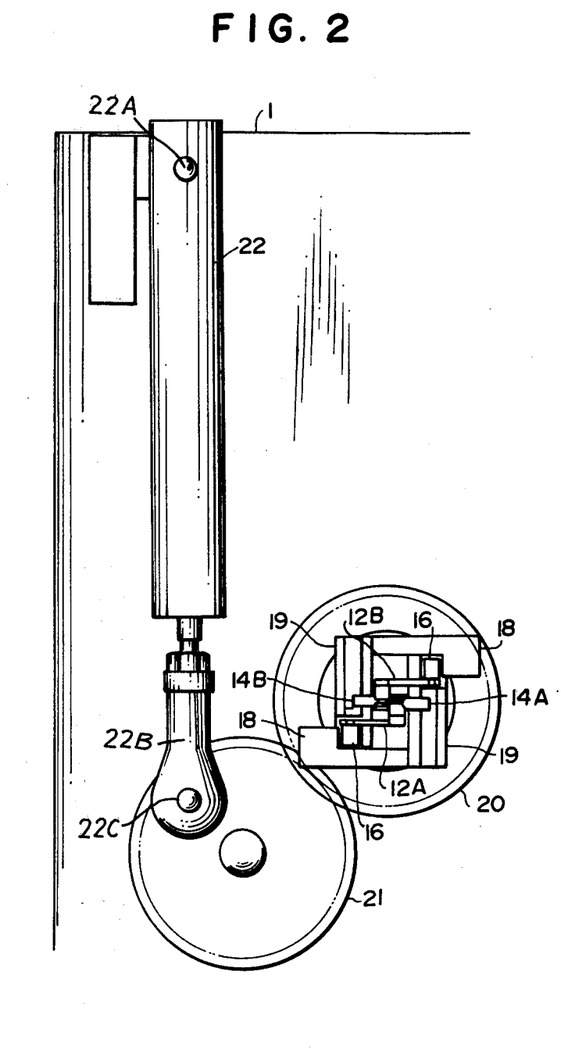
FIG. 2 is a plan view of the apparatus depicted in FIG. 1.
Figure 3:
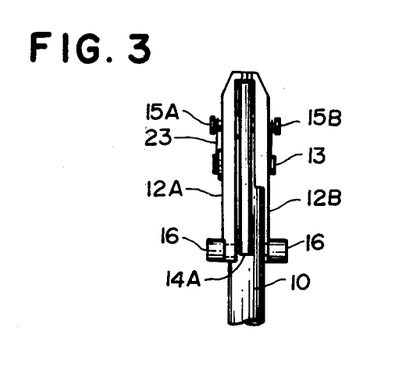
FIG. 3 is a side elevational view illustrating a bending lever and a cutting lever of the apparatus depicted in FIG. 1.

Referring now to FIG. 1, driving cylinder 2 is formed at its lower end with a gear 20 fixed therearound at its lower end for engaging a gear 21 pivotally mounted on base 1 for rotating driving cylinder 2 about its vertical axis. Gear 21 is rotated by a direction-changing pneumatic cylinder 22 having a piston 22B. Cylinder 22 is pivotally mounted on a shaft 22A fixed to base 1 with piston 22B rotatably mounted on a shaft 22C gear 21 as shown in FIG. 2.

A pneumatic pressure source 100 for displacing driving cylinder 2 towards printed circuit substrate 40 and sliding cam rod 17 along driving shaft 10 for displacing cutting cam 19 and bending cam 18 and actuating direction-changing cylinder 22 is provided. An automatically controlled pneumatic valve 100A is provided intermediate pneumatic pressure source 100 and first cylinder chamber 8A for regulating the pneumatic pressure in first cylinder chamber 8A by an automatic pneumatic control circuit (not shown). Similarly, a series of pneumatic control valves 100B, 100C and 100D are provided intermediate pneumatic pressure source 100 and the remaining cylinder chambers 8B, 8C and 8D, respectively, for regulating the pneumatic pressure therein. An automatic pneumatic control valve 100E is provided intermediate pneumatic pressure source 100 and direction-changing pneumatic cylinder 22 for regulating the pneumatic pressure in direction-changing pneumatic cylinder 22.

Figure 4:
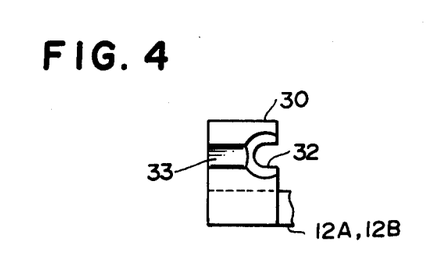
FIG. 4 is a plan view of the end portion of the bending lever of the apparatus depicted in FIG. 1.
Figure 5:
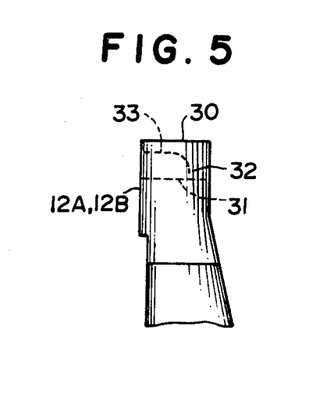
FIG. 5 is a front elevational view of the end portion of the bending lever illustrated in FIG. 4.
Figure 6:
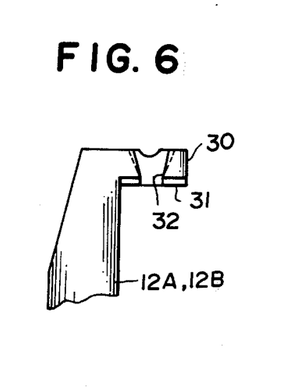
FIG. 6 is a side elevational view of the end portion of the bending lever illustrated in FIGS. 4 and 5.

Referring now to FIGS. 4-6, the top end portions of bending levers 12A and 12B are shown in detail. Bending levers 12A and 12B each are formed at their top ends with an overhanging projection 30 in the shape of an inverted L. The lower inside surface of each overhanging projection 30 is formed with an anvil shaped cutting surface 31 adapted to oppose cutting edges 55 formed in cutting levers 14A and 14B for cutting leads 42. Each side portion of overhanging projections 30 is formed with a U-shaped groove 32 for engaging leads 42 and is formed further with a second U-shaped groove 33 on each upper surface of overhanging projections 30 for engaging leads 42 during the bending operation.

Figure 8:
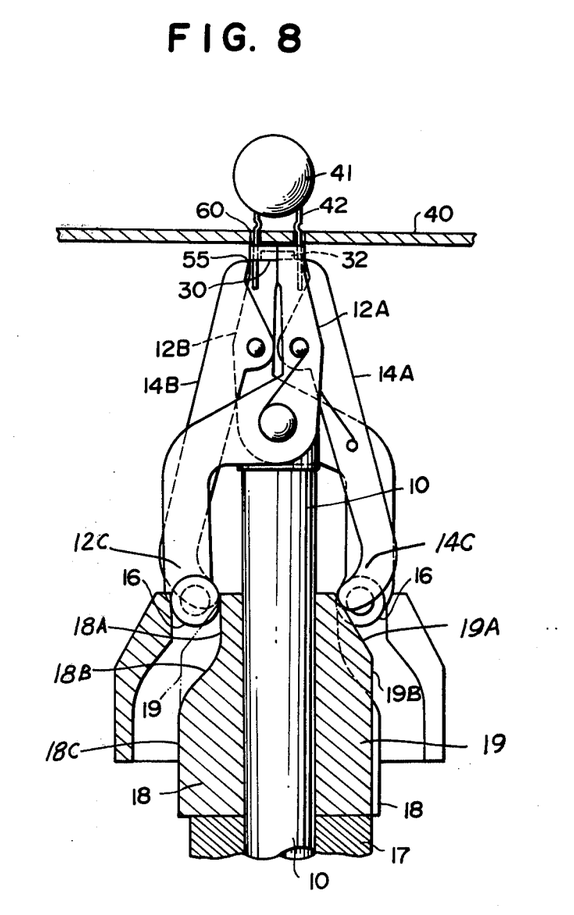

Prior to the cutting and bending operations being performed, the top ends of the opposed pair of bending levers 12A and 12B are engaged while the top ends of cutting levers 14A and 14B are kept apart. When the cutting and bending operations are to be performed, the apparatus is positioned below designated electronic component 41 which has been inserted into lead receiving holes 60 of printed circuit substrate 40 so that grooves 32 at the top ends of each pair of levers are positioned just below leads 42. Compressed air is supplied to third cylinder chamber 8C of driving cylinder 2 by pneumatic control valve 100C and pneumatic pressure is applied to piston 7 causing lower cylinder 5 to slide along rod 9 and driving cylinder 2 is displaced upwardly thereby displacing the upper portion of the entire apparatus towards printed circuit substrate 40. As bending levers 12A and 12B are displaced to the point of almost contacting printed circuit substrate 40, leads 42 are inserted into each U-shaped groove 32 formed on the side of overhanging projections 30 as shown in FIG. 8.

At this time, compressed air is provided to second cylinder chamber 8B of driving cylinder 2 by pneumatic control valve 100B. Upper piston 6 is displaced upwardly along the interior wall of upper cylinder 4. Cam rod 17 is displaced upwardly about driving shaft 10 and bending cams 18 and cutting cams 19 are similarly displaced.

Figure 9:
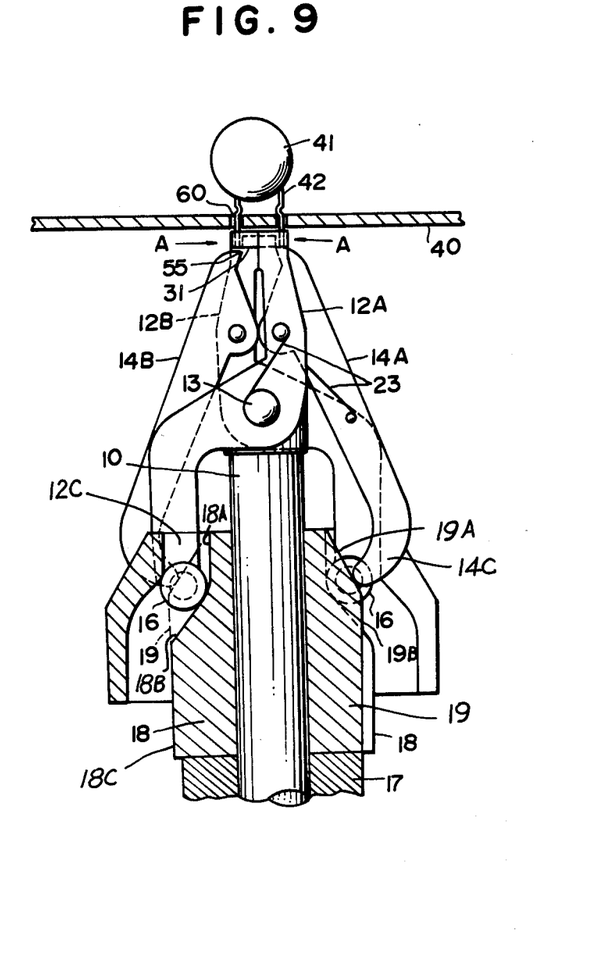

Referring specifically to FIG. 9, as camming portions 14C are driven along cam cutting surface 19A of cutting cam 19, each cutting lever 14A and 14B is pivoted about pins 15A and 15B, respectively, for moving the upper portions of cutting levers 14A and 14B towards each other as indicated by arrows A. Leads 42 engaged between cutting edges 55 of cutting levers 14A and 14B and cutting surfaces 31 of bending levers 12A and 12B are cut at a predetermined length. As the cutting operation is performed, and upper piston 6 is being displaced upwardly in upper cylinder 4, rollers 16 pivotally mounted at the rear end of bending levers 12A and 12B are driven over upper cam vertical surfaces 18A of cams 18 for maintaining the relative position of camming portions 12C.

Figure 10:
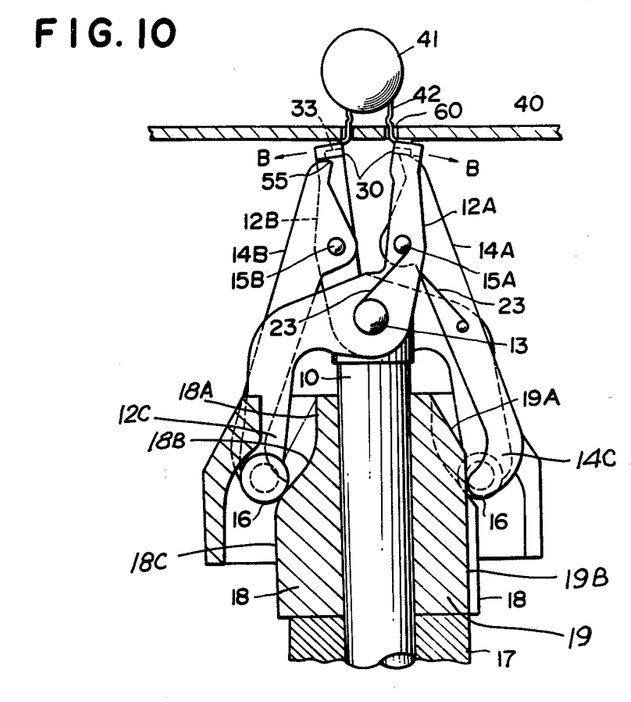
Figure 11:
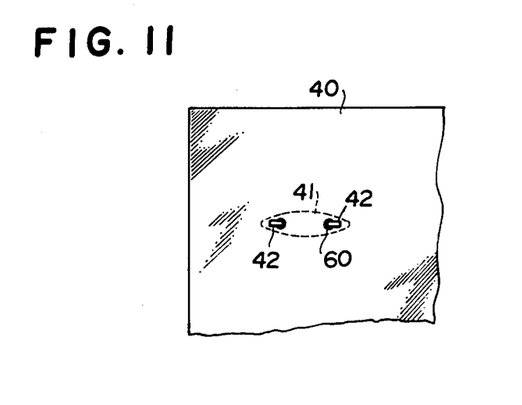
FIG. 11 is a bottom plan view illustrating the underside of the printed circuit substrate illustrating leads which have been treated by the apparatus depicted in FIG. 1.

After the cutting operation is performed and cam rod 17 is displaced further upwardly, camming portions 12C of bending levers 12A and 12B are displaced apart as rollers 16 are driven over cam bending surfaces 18B of bending cams 18. Bending levers 12A and 12B are pivoted about pin 13 separating the upper portions of bending levers 12A and 12B as indicated by the direction of the arrows B in FIG. 10. As bending levers 14A and 14B are pivoted about pin 13, leads 42 are bent by engagement of leads 42 by U-shaped grooves 33 provided on the upper surfaces of overhanging projections 30. Bending of each lead is performed firmly and securely in opposite directions along a common line as shown in FIG. 11.

After completion of the bending operation, pneumatic pressure in third cylinder chamber 8C is released by pneumatic control valve 100C and fourth cylinder chamber 8E is pressurized by pneumatic control valve 100D. At this time, driving cylinder 2 is returned to its starting position as fourth cylinder chamber 8D is pressurized and lower cylinder 5 is displaced along rod 9 until driving cylinder 2 abuts base 1. As driving cylinder 2 is displaced downwardly, bending levers 12A and 12B and cutting levers 14A and 14B and respective bending cams 18 and cutting cams 19 are lowered with driving shaft 10 maintaining their relative positions as illustrated in FIG. 10.

Pressure in second cylinder chamber 8B is reduced by a signal to pneumatic control valve 100B and first cylinder chamber 8A is pressurized by pneumatic control valve 100A for displacing upper piston 6 downwardly. As cam rod 17 and bending cams 18 and cutting cams 19 are displaced downwardly along driving shaft 10 to their original positions, bending levers 12A and 12B and cutting levers 14A and 14B return to their original positions of FIG. 1 by camming action of bending cams 18 and cutting cams 19.

Referring now to FIG. 2, driving cylinder 2 can be rotated about its vertical axis by actuation of direction-changing cylinder 22. As direction-changing cylinder 22 is pressurized by opening pneumatic control valve 100E, piston rod 22A is displaced and gear 21 is rotated for rotating gear 20 engaged therewith and driving cylinder 2 is selectively rotated in the coordinate X and Y directions.

By constructing and arranging an apparatus for cutting and bending the leads of a parallel lead electronic component inserted into the lead receiving openings of a printed circuit substrate in this manner, the leads of the electronic component can be cut and bent so as to extend along and contact with the bottom surface of the printed circuit board consistently for overcoming the problem of an electronic component falling out of the lead receiving openings prior to soldering. Additionally, as no excessive force is applied to the electronic components, correction of the position of the electronic component on the printed circuit substrate is not required after the securing operation. Moreover, the cutting and bending operations performed by the apparatus ensure a highly efficient and accurate processing operation. In addition, the subsequent soldering of the leads to the printed circuit substrate can be performed with improved reliability.

The apparatus constructed and arranged in accordance with the invention has been described whereby driving cylinder 2 is displaced by a pneumatic pressure source 100. It is to be understood that driving cylinder 2 may be displaced hydraulically or by an alternative means. Similarly, the apparatus has been described with an essentially vertical axis mounted on an essentially horizontal base, however, the apparatus may be positioned in any desired direction relative to a horizontal plane for performing the securing operation.

Referring now to FIGS. 12-16, an apparatus for cutting and bending the leads of a parallel lead electronic component inserted into the lead receiving openings of a printed circuit substrate including a lead chip removal sub-assembly and a sub-assembly for detecting the presence of the inserted electronic component prior to performing the cutting and bending operation of the leads is shown. Like elements of the apparatus for performing identical functions are identified by like numerals employed in FIGS. 1-10.

Figure 12:
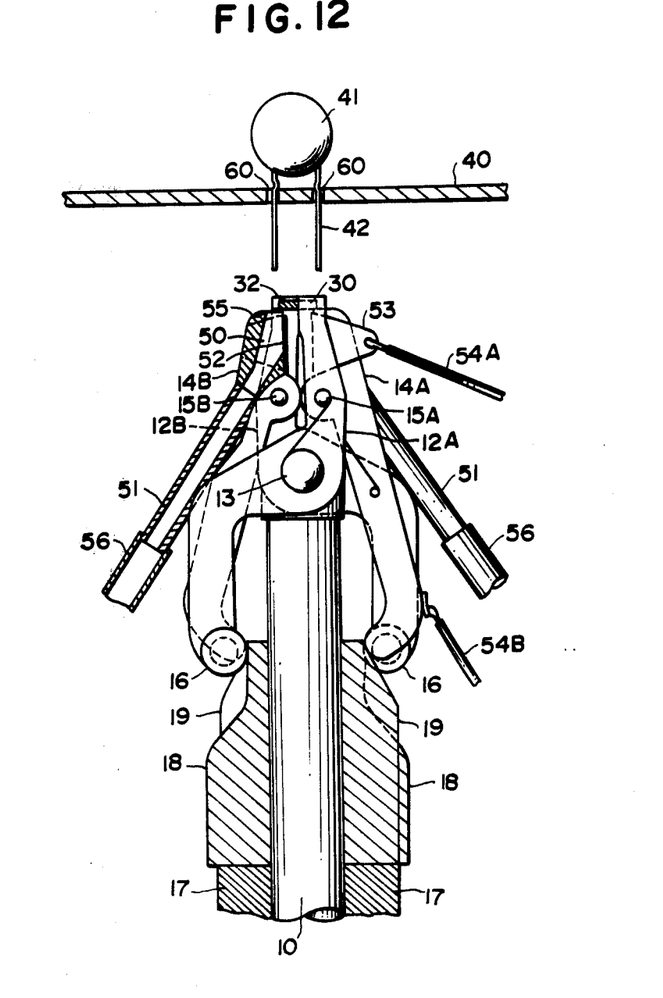
FIG. 12 is a partial cross-sectional front elevational view illustrating the chip disposal sub-assembly constructed and arranged in accordance with this embodiment of the invention.

Referring specifically to FIG. 12, electronic component 41 formed with parallel leads 42 is shown inserted into lead receiving opening 60 formed in printed circuit substrate 40. The apparatus constructed and arranged in accordance with this embodiment of the invention is shown positioned beneath leads 42. Opposed bending levers 12A and 12B are pivotally mounted to the top portion of driving shaft 10 by pins 13. Cutting levers 14A and 14B are pivotally mounted to the inner opposed surfaces of bending levers 12A and 12B by means of pins 15A and 15B, respectively. Rollers 16 are rotatably mounted to the rear ends of bending levers 12A and 12B. Cutting levers 14A and 14B are each formed further with a lead receiving channel 50 therethrough for receiving leads 42 as driving shaft 10 is displaced towards printed circuit substrate 40. Cutting levers 14A and 14B are each fitted with a chip ejecting pipe 51 secured by screw thread or otherwise to the lower end of lead receiving channel 50.

A detecting conductor plate 53 is mounted by an insulating adhesive to the interior face of cutting lever 14A for forming a three sided]-shaped enclosure around the end of cutter lever 14A for cooperating with lead receiving channel 50 for defining a bore for receiving lead 42 of electronic component 41. Detecting conductor plate 53 is completely electrically insulated from cutter lever 14A and they are connected electrically through two lead wires 53A and 53B to a detector (not shown) for detecting electrical conductivity between cutting lever 14A and detecting conductor plate 53.

Cutting lever 14B is formed in the same manner as cutting lever 14A and includes a guide plate 52 for facilitating insertion of lead 42 into lead receiving channel 50. Cutting levers 14A and 14B are formed with cutting edges 55 at the top end portions of the inner side of lead receiving channels 50 for performing the cutting operation. Each chip ejecting pipe 51 is provided with a flexible chip ejecting tube 56 for depositing lead chips into a receiver (not shown). Chip ejecting tubes 56 are formed from a flexible material, such as rubber, vinyl or the like.

Prior to commencing the bending and cutting operations, the upper portions of bending levers 12A and 12B are engaged as described for the embodiment of the invention illustrated in FIGS. 1–10. Lead receiving channels 50 at the upper portion of cutting levers 14A and 14B are maintained in alignment with U-shaped grooves 32 formed on overhanging projections 30 of bending levers 12A and 12B as described for the embodiment of the invention illustrated in FIGS. 1–10. The apparatus is positioned below electronic component 41 inserted into printed circuit substrate 40 and driving shaft 10 and cam rod 17 are displaced towards printed circuit substrate 40. Leads 42 of electronic component 41 are received by U-shaped grooves 32 of bending levers 12A and 12B and lead receiving channels 50 of cutting levers 14A and 14B.

Figure 13:
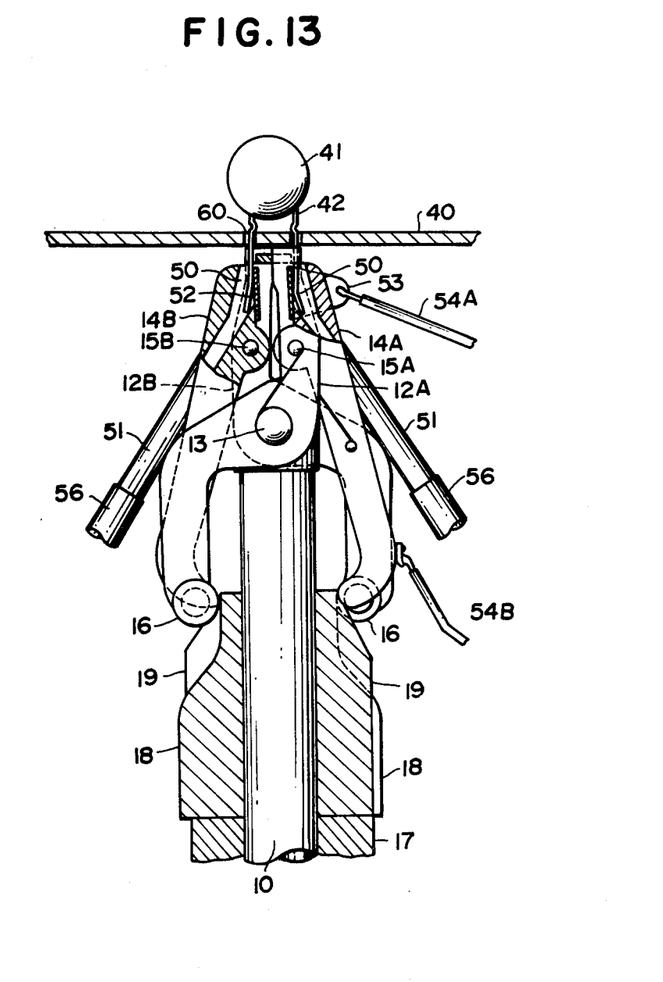
FIG. 13 is a partial cross-sectional front elevational view of the apparatus depicted in FIG. 12 prior to cutting the leads.

As bending levers 12A and 12B are displaced to a position almost in contact with printed circuit substrate 40, as shown in FIG. 13, cutting lever 14A and detecting conductor plate 53 are electrically short-circuited to each other by one lead 42 of inserted electronic component 40. This electrical short-circuit is detected by the detector (not shown) through lead wires 54A and 54B which permits the apparatus to perfrom the cutting operation.

Figure 14:
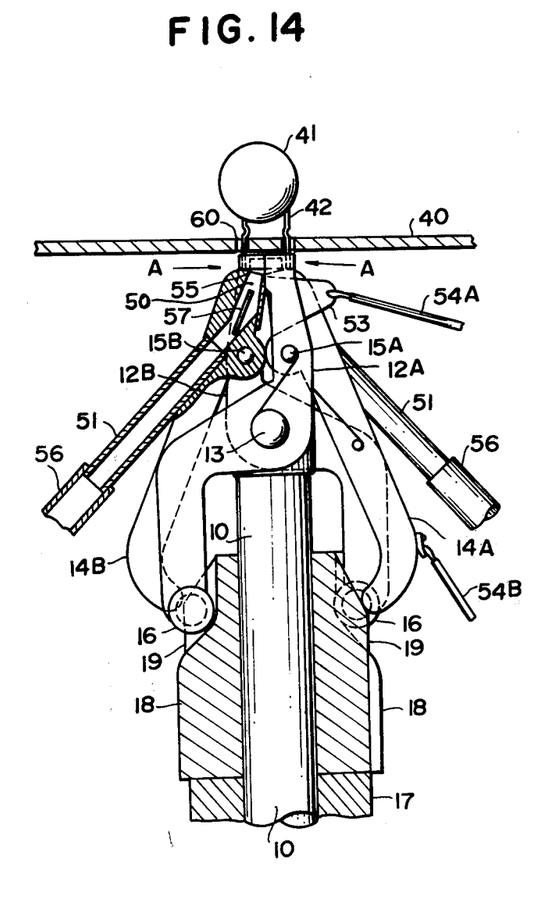
FIG. 14 is a partial cross-sectional front elevational view of the apparatus depicted in FIG. 12 during the cutting operation.

The cutting operation is performed as cam rod 17 is displaced along driving shaft 10 towards printed circuit substrate 40 when driving shaft 10 is stationary so that cutting cams 19 are engaged with camming portions 14C of cutting levers 14A and 14B for opening the upper portions of cutting levers 14A and 14B. As shown in FIG. 14, the upper portions of cutting levers 14A and 14B are pivoted in the direction indicated by arrows A for cutting leads 42 by their respective cutting edges 55. A severed lead piece or chip 57 is shown being ejected through one lead receiving chamber 50 for transportation to a receiver (not shown) through respective chip ejecting pipe 51 and chip tubes 56.

Figure 15:
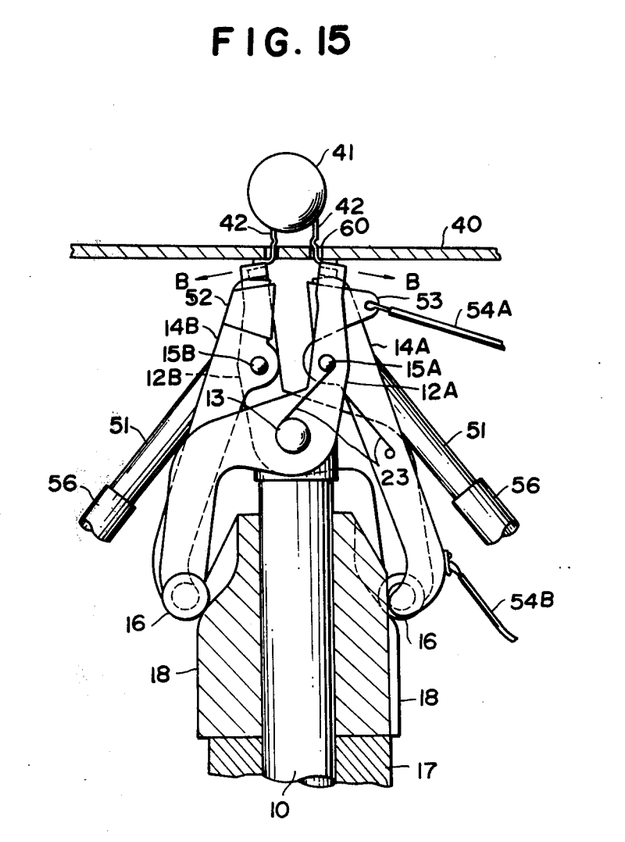
FIG. 15 is a partial cross-sectional front elevational view of the apparatus depicted in FIG. 12 illustrating the bending operation.
Figure 16:
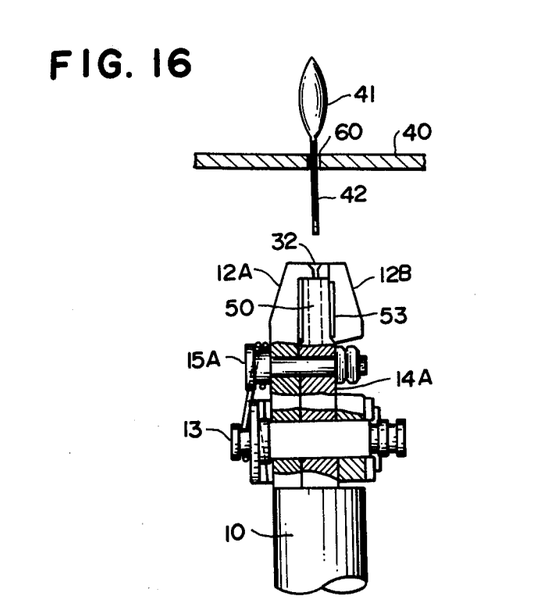
FIG. 16 is a cross-sectional view of the apparatus depicted in FIG. 12.
Figure 17:
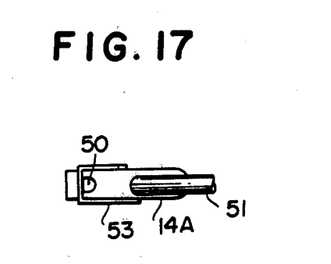
FIG. 17 is a plan view of the cutting lever of the apparatus depicted in FIG. 12.
Figure 18:
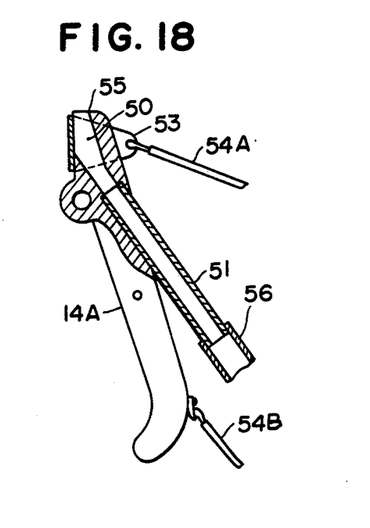
FIG. 18 is a sectional view of the cutting lever illustrated in FIG. 17.

In case a designated electronic component is not present in lead receiving openings 60 of printed circuit substrate 40 due to mis-insertion or loss of electronic component 41, the electrical short-circuit between detecting conductor plate 53 and cutting lever 14A is not made and the detector will detect the absence of lead 42 and stop the apparatus. Thus, the misinsertion or loss of electronic component 41 in printed circuit substrate 40 can be determined easily. On the other hand, if electronic component 41 is properly inserted into lead receiving opening 60 of printed circuit substrate 40, after the cutting operation, cam rod 17 is displaced further along driving shaft 10 towards printed circuit substrate 40 for performing the bending operation. During this further displacement of cam rod 17, rollers 16 are driven over cam bending surface 18B for pivoting bending levers 12A and 12B so that the upper portions thereof are displaced in the direction of arrows B, as illustrated in FIG. 15 for performing the bending of leads 42 by engagement of leads 42 in U-shaped grooves 32 of overhanging projection 30 on bending levers 12A and 12B.

As stated above, in accordance with this embodiment of the invention, the presence of leads 42 of electronic component 41 in lead receiving channel 50 of cutting lever 14A is detected accurately by detecting conductor plate 53. Therefore, it is possible to discriminate between the presence and absence of electronic component 41 in a designated position of printed circuit substrate 40 prior to forming the cutting and bending operations. By stopping the apparatus upon detection of a missing electronic component 41 in a designated position, the loss or mis-insertion and the like can be detected at an early stage of securing a series of electronic components 41 to printed circuit substrate 40. Accordingly, printed circuit substrate 40 can be removed from the apparatus prior to expenditure of time and energy in performing the cutting and bending operation on this and the remainder of the electronic elements of the circuit.

In addition, in accordance with this embodiment of the invention, chips 57 of lead material generated during the cutting operation are not scattered about, but are ejected effectively through chip ejecting pipes 51 and chip ejecting tubes 56 thereby preventing damage to the apparatus by chips 57 engaging in the driving mechanisms. In this embodiment of the invention, detection by electrical short-circuiting is performed just prior to the cutting operation which stops the apparatus when the short-circuit is not detected. However, detection may be performed either at the time of cutting or immediately thereafter which may suspend the subsequent bending operation. In addition, guide plate 50 provided on cutting lever 14B for facilitating insertion of lead 42 into lead receiving channel 50 can be eliminated, if position and orientation of lead receiving channel 50 is selected so as to facilitate and insure consistent insertion of lead 42 therein.

Accordingly, by constructing and arranging an apparatus for cutting and bending the leads of a parallel lead electronic component inserted into the lead receiving openings formed in a printed circuit substrate in accordance with the invention, the operations of cutting the inserted leads to a predetermined length and bending the cut leads may be consistently and efficiently performed. In addition, lead chips generated by the cutting operation may be disposed of safely to prevent damage to the driving mechanisms of the apparatus. Furthermore, a detection sub-assembly including an electrical short-circuit provided by an inserted lead enables detection of the presence of a properly inserted electronic component into the designated lead receiving holes formed in the printed circuit substrate for terminating the cutting and bending operations when a component is missing or mis-inserted.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An apparatus for trimming and securing leads of a parallel lead electronic component to a circuit substrate by cutting and bending the leads of the component inserted into the substrate comprising:
    a base;
    driving means mounted on said base and adapted to be reciprocatively displaced between a first position away from said substrate and a second position towards said substrate;
    bending means mounted on said driving means for bending said leads;
    cutting means mounted on said bending means for cutting said leads; and
    cam means mounted on said driving means and engageable with said cutting means and said bending means for actuation of said cutting means and said bending means in response to displacement of said driving means, said cam means including cutting cam means and bending cam means on the driving means, said cutting cam means adapted to selectively engage said cutting means for actuation of said cutting means and said bending cam means adapted to selectively engage said bending means for actuation of said bending means.

2. The apparatus of claim 1, wherein said driving means includes driving cylinder means mounted on said base and shaft means slideably mounted in said driving cylinder means, said bending means and said cam means mounted on said shaft means, said driving cylinder means adapted to displace said shaft means between a first position away from said substrate and a second position towards said substrate for reciprocatively displacing said cam means between a first position out of operational engagement with said cutting means and said bending means and a second position for operationally engaging said cutting means and said bending means.

3. The apparatus of claim 2, wherein said driving cylinder means is an elongated cylinder including a partition for defining said cylinder into a first cylinder and a second cylinder, said shaft means secured to said partition and extending through the axis of said first cylinder, a first piston slideably engaged in said first cylinder about said shaft means and coupled to said cam means for defining a first cylinder chamber and a second cylinder chamber and a second piston slideably mounted in said second cylinder for defining a third cylinder chamber and a fourth cylinder chamber and said second piston fixed to said base, said drive cylinder means and said shaft means are selectively displaceable by pneumatic pressure.

4. The apparatus of claim 2, wherein said cutting cam means includes a cutting cam slideably mounted on said shaft means and cutting cam follower means on said cutting means for reciprocatively displacing said cutting means between a first position out of engagement with said leads and a second position in engagement with said leads for cutting said leads in response to displacement of said shaft means with respect to said driving cylinder means, and said bending cam means includes a bending cam slideably mounted on said shaft means and bending cam follower means for reciprocatively displacing said bending means between a first position out of engagement with said leads and a second position in engagement with said leads for bending said leads in response to displacement of said shaft means with respect to said driving cylinder means.

5. The apparatus of claim 1, wherein said bending means is a pair of opposed bending levers pivotally mounted on said driving means, each said bending lever formed with a bending arm having an overhanging projection with lead receiving means for receiving and bending said leads.

6. The apparatus of claim 5, wherein said cutting means includes a pair of opposed cutting levers, one cutting lever pivotally mounted on each of said bending levers, each said cutting lever formed with cutting means for cutting said leads.

7. The apparatus of claim 4, wherein said driving cylinder means is an elongated cylinder including a partition for defining said cylinder into a first cylinder and a second cylinder, said shaft means secured to said partition and extending through the axis of said first cylinder, a first piston slideably engaged in said first cylinder about said shaft means and coupled to said cam means for defining a first cylinder chamber and a second cylinder chamber and a second piston slideably mounted in said second cylinder for defining a third cylinder chamber and a fourth cylinder chamber and said second piston fixed to said base.

8. The apparatus of claim 7, wherein said bending means is a pair of opposed bending levers pivotally mounted on said shaft means, each said bending lever formed with a bending arm having an overhanging projection with lead receiving means for receiving and bending said leads.

9. The apparatus of claim 8, wherein said cutting means includes a pair of opposed cutting levers, one cutting lever pivotally mounted on each of said bending levers, each said cutting lever formed with cutting means for cutting said leads.

10. The apparatus of claim 9, wherein each said projection includes a side face formed with a first groove for engaging said leads an upper face having a second groove for engaging said lead when said lead is bent and a lower face having a cutting edge for cutting said lead in cooperation with said cutting means.

11. The apparatus of claim 8, wherein each said bending lever includes an opposed arm having a cam follower portion and a roller pivotally mounted on said cam follower portion thereof for engaging said bending cam for operatively pivoting said bending levers.

12. The apparatus of claim 9, wherein each of said cutting levers is formed with a lead receiving groove on a first arm for receiving a lead and a pipe for ejecting chips of lead generated during lead cutting operation, said pipe being connected with said lead receiving groove.

13. The apparatus of claim 12, wherein one of said cutting levers includes a detecting electrode means adapted to contact with at least one lead of said electronic component inserted into said printed circuit substrate for detecting the presence or absence of said lead.

14. The apparatus of claim 13, wherein said detecting electrode means is a detecting conductor plate mounted on said cutting lever adapted to surround a portion of said lead receiving groove of said cutter lever.

15. The apparatus of claim 1, wherein said driving means is rotatably mounted on said base, said apparatus including first gear means fixed to said driving means and second gear means rotatably mounted on said base for engaging with said first gear means and rotating cylinder means for rotating said second gear means for rotating said driving means.

16. The apparatus of claim 9, wherein each said cutting lever includes an opposed arm having a cam follower portion for engaging said cutting cam for operatively pivoting said cutting levers.

* * * * *